(12) United States Patent
Adam et al.

(10) Patent No.: US 7,141,480 B2
(45) Date of Patent: Nov. 28, 2006

(54) TRI-GATE LOW POWER DEVICE AND METHOD FOR MANUFACTURING THE SAME

(75) Inventors: Lahir Shaik Adam, Plano, TX (US); Eddie H. Breashears, Lucas, TX (US); Alwin J. Tsao, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/810,419

(22) Filed: Mar. 26, 2004

(65) Prior Publication Data
US 2005/0215022 A1    Sep. 29, 2005

(51) Int. Cl.
*H01L 21/331* (2006.01)
(52) U.S. Cl. ................. 438/369; 438/258
(58) Field of Classification Search ........... 438/258, 438/275, 279, 369, 528, 593, 594
See application file for complete search history.

(56) References Cited

U.S. PATENT DOCUMENTS

| | | | |
|---|---|---|---|
| 5,942,780 A | | 8/1999 | Barsan et al. |
| 6,147,008 A | | 11/2000 | Chwa et al. |
| 6,159,795 A | * | 12/2000 | Higashitani et al. ........ 438/257 |
| 6,165,849 A | * | 12/2000 | An et al. ..................... 438/275 |
| 6,204,159 B1 | * | 3/2001 | Chang et al. ................ 438/594 |
| 6,258,673 B1 | * | 7/2001 | Houlihan et al. ........... 438/275 |
| 6,268,251 B1 | * | 7/2001 | Zhong et al. ................ 438/275 |
| 6,653,192 B1 | | 11/2003 | Ryoo |
| 6,890,822 B1 | | 5/2005 | Kim et al. |
| 2002/0105041 A1 | | 8/2002 | Goto et al. |
| 2002/0127882 A1 | | 9/2002 | Chen |
| 2004/0266113 A1 | * | 12/2004 | Kirkpatrick et al. ........ 438/275 |

\* cited by examiner

*Primary Examiner*—Phuc T. Dang
(74) *Attorney, Agent, or Firm*—Rose Alyssa Keagy; W. James Brady; Frederick J. Telecky, Jr.

(57) ABSTRACT

The present invention provides a tri-gate lower power device and method for fabricating that tri-gate semiconductor device. The tri-gate device includes a first gate [455] located over a high voltage gate dielectric [465] within a high voltage region [460], a second gate [435] located over a low voltage gate dielectric [445] within a low voltage core region [440] and a third gate [475] located over an intermediate core oxide [485] within an intermediate core region [480]. One method of fabrication includes forming a high voltage gate dielectric layer [465] over a semiconductor substrate [415], implanting a low dose of nitrogen [415a] into the semiconductor substrate [415] in a low voltage core region [440], and forming a core gate dielectric layer [445] over the low voltage core region [440], including forming an intermediate core gate dielectric layer [485] over an intermediate core region [480].

16 Claims, 4 Drawing Sheets

TRI-GATE LOW POWER DEVICE AND METHOD FOR MANUFACTURING THE SAME

TECHNICAL FIELD OF THE INVENTION

The present invention is directed, in general, to a method for manufacturing a tri-gate integrated circuit and, more specifically, to a method for growing differential nitrided oxides for low power applications.

BACKGROUND OF THE INVENTION

Dual gate integrated circuits having both high voltage devices, which may also be referred to herein as input/output (I/O) devices, and low voltage, or core, devices have gained wide acceptance and utility in the semiconductor industry since their introduction. Because of the different operating voltages associated with the core device versus the I/O device, the gate oxide for the lower voltage core device is much thinner than the gate oxide for the higher voltage I/O device. For example, the thickness of the gate oxide for the core device may range from about 0.7 nm to about 2 nm, while the thickness of the gate oxide for the I/O device may range from about 2.5 nm to about 8 nm.

Conventional processes have, therefore, required manufactures to proceed through a number of mask, etch and clean steps to achieve these different gate oxide thicknesses. In a typical process, the thicker I/O gate oxide is produced by first growing the desired thickness of oxide over the surface of the wafer. The desired I/O areas are then protected using well known masking and photolithographic processes. The oxide that is not protected by the mask is removed with conventional etch processes, after which the mask is removed. The appropriate clean steps are then conducted, and the wafer is subjected to a second, carefully controlled oxidation process to grow the thinner gate oxide for the core devices.

These conventional processes do achieve the desired thicknesses for the different devices. Unfortunately, however, the grow, mask, etch, clean and re-grow steps potentially damage the silicon surface that can lead to leakage at the interface of the silicon and the gate oxide. This leakage is undesirable, particularly in the low voltage or core devices. In addition, these multiple process steps introduces manufacturing complexity in that more variables are introduced into a process in which hundreds of variables already exist.

To avoid these additional process steps, manufactures turned to conducting a high dose nitrogen implant in the core device areas. In this process, the I/O device areas are masked off, and a high dose of nitrogen is implanted into the low voltage core device areas. Upon completion of the nitrogen implant, the mask is removed and the wafer is subjected to an oxidizing environment. The result is that the respective target thicknesses for each of the device areas are achieved without the additional process steps. Unfortunately, however, manufacturers have become reluctant to use this high dose nitrogen implant because it has been found to damage the silicon surface, which can also lead to leakage within the device.

Accordingly, what is needed in the art is a method of manufacturing an integrated circuit that overcomes the disadvantages associated with the prior art process discussed above.

SUMMARY OF THE INVENTION

To address the above-discussed deficiencies of the prior art, the present invention provides a method for fabricating a tri-gate semiconductor device. In one embodiment, the method includes forming a high voltage gate dielectric layer over a semiconductor substrate, implanting a low dose of nitrogen into the semiconductor substrate in a low voltage core region, and forming a core gate dielectric layer over the low voltage core region, including forming an intermediate core gate dielectric layer over an intermediate core region.

In another embodiment, the present invention provides a method for manufacturing a tri-gate integrated circuit. In this embodiment, the method includes forming high voltage gate dielectric layers over a semiconductor substrate, implanting a low dose of nitrogen into the semiconductor substrate in low voltage core regions, and forming core gate dielectric layers over the low voltage core regions, including forming intermediate core gate dielectric layers over intermediate core regions. To complete the transistor structure, this embodiment further includes forming first transistor gates over the high voltage gate dielectric layers, second transistor gates over the low voltage core gate dielectric layers and third transistor gates over the intermediate core dielectric layers. Source/drain regions associated with each of the first, second and third transistor gates are also formed. Interconnects extending through dielectric layers located over the first, second and third transistor gates interconnect the first, second and third transistor gates to form an operative integrated tri-gate circuit.

In another embodiment, the present invention provides a tri-gate semiconductor device. In this particular embodiment, the tri-gate semiconductor device includes a semiconductor substrate a first gate located over said semiconductor substrate and over a high voltage gate dielectric within a high voltage region, a second gate located over said semiconductor substrate and over a low voltage gate dielectric within a low voltage core region, and a third gate located over said semiconductor substrate and over an intermediate core dielectric within an intermediate core region.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following detailed description taken in conjunction with the accompanying FIGUREs. It is emphasized that various features may not be drawn to scale. In fact, the dimensions of various features may be arbitrarily increased or reduced for clarity of discussion. In addition, it is emphasized that some circuit components may not be illustrated for clarity of discussion. Reference is now made to the following descriptions taken in conjunction with the accompanying drawings, in which.

DETAILED DESCRIPTION

Figure 1:
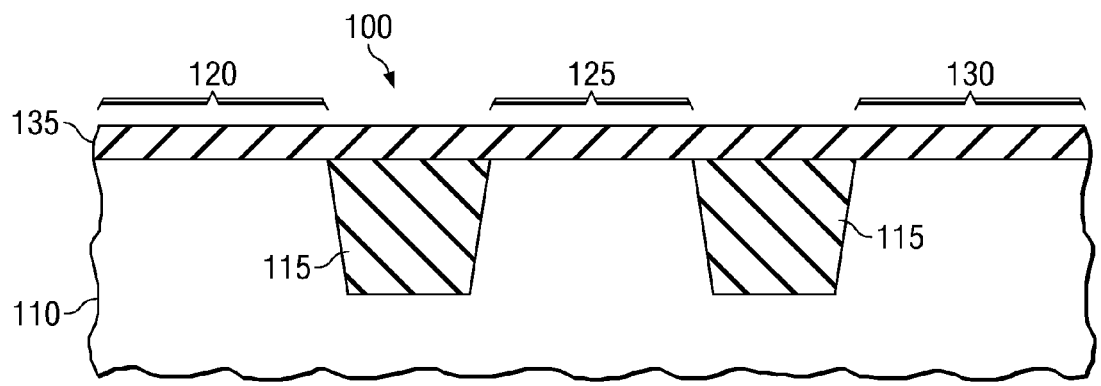
FIG. 1 illustrates a sectional view of a tri-gate device at an early stage of fabrication with a high voltage gate dielectric formed on a semiconductor substrate.

It is presently recognized that heretofore unknown tri-gate transistor devices have certain operational advantages over conventional dual gate transistors devices. For example, power consumption in certain electronic applications, such as cellular phones and other wireless data transmission and receiving devices, is of critical concern, particularly given the increased applications that are now available through these devices. While speed is of great importance in performing these increased data tasks, it has also presently become desirable to conserve as much power as possible when the higher performance functions are not required. In view of this, the present invention uniquely recognizes advantages associated with the use of tri-gate transistors and addresses the manufacturing problems that arise with the formation of these tri-gate structures.

It is well known that low voltage core gates with their thinner gate dielectrics provide an electronic device with high performance and speed for heavy data operations. Unfortunately, however, the thinner dielectric gates required for these low voltage core transistors are notoriously known for their high current leakage during use. It is presently recognized that these high performance electronic devices can benefit from the presence of an intermediate core transistor that has less leakage associated with it, which is attributable primarily to the slightly thicker gate dielectric associated with the intermediate core transistor. During periods of non-high performance or standby use, the device would utilize the intermediate core transistors in place of using the leakier low voltage core transistors, thereby conserving power. In order for this to be accomplished, however, the present invention recognizes that the intermediate core transistors must be manufactured to have a slightly thicker gate dielectric than the main core transistors. At the same time, however, it is highly desirable to eliminate as many manufacturing steps as possible, and thereby, inflict as little damage as possible on the semiconductor substrate.

The present invention, therefore, uniquely recognizes that several masking and cleaning processing steps can be avoided and a high quality dielectric gate can be achieved by lightly doping with nitrogen a portion of a semiconductor substrate over which a low voltage core gate dielectric, such as an oxide, and transistor are to be formed. This is preferably done subsequent to the formation of a much thicker high voltage gate dielectric in an I/O region. With the lightly doped nitrogen in place, the low voltage core gate dielectric and an intermediate core gate dielectric can then be simultaneously formed, and the different target thickness for both of these gates can be obtained. This is due in large part to the low nitrogen dose at the semiconductor surface and the close thickness values between the low voltage core gate dielectric layer and the intermediate core gate dielectric layer. The presence of the light doping within the low voltage core region also uniquely and unexpectedly provides for a more uniform nitrogen doped gate in the low voltage core region, which further enhances the quality of these devices, as explained in more detail below.

Turning initially to FIG. 1, there is illustrated a sectional view of a tri-gate device 100 at an early stage of manufacture. In this particular view, there is illustrated a semiconductor substrate 110, such as a silicon substrate, having conventional isolation structure 115 formed therein. For purposes of discussion here, the isolation structure 115 divides the semiconductor substrate 110 into a low voltage core region 120 a high voltage region 125, which may also be an (I/O) region, and an intermediate core region 130. Also shown, is a high voltage gate dielectric layer 135 that has been conventionally grown over the semiconductor substrate 110, including the low voltage core region 120 and the intermediate core region 130. The high voltage gate dielectric layer 135 is grown to a thickness that meets the design specifications of the intended device, and thus, may vary. However, in certain embodiments, the thickness ranges from about 2.5 nm to about 8 nm. In addition, the respective gate dielectric thicknesses should be sufficient to withstand the operating voltages of the high voltage transistors. For example, the operating voltage of the I/O may range from about 1 volt to about 5 volts, whereas the operating voltage of the low voltage core region 120 may range from about 0.7 volts to about 1.5 volts and the operating voltage of the intermediation region 130 may range from about 0.8 volts to about 1.5 volts.

Figure 2:
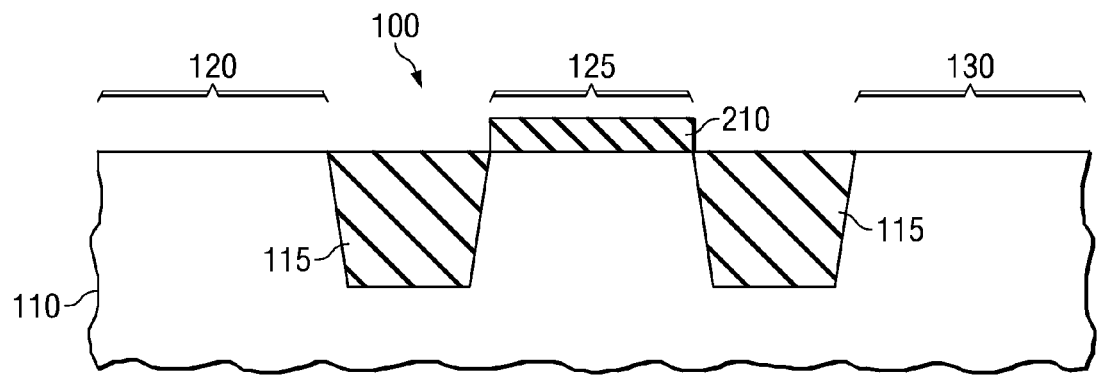
FIG. 2 illustrates a sectional view of the device of FIG. 1 subsequent to the removal of the high voltage gate dielectric over the low voltage core region and the intermediate core region.

Turning next to FIG. 2, there is shown the device 100 of FIG. 1 after the conventional patterning of the high voltage gate dielectric layer 135. As illustrated, the high voltage gate dielectric layer 135 has been conventionally removed from both the low voltage core region 120 and the intermediate core region 130 to form a high voltage gate dielectric layer 210. It should be understood that at this point, the target thickness of the high voltage gate dielectric layer 210 may not be fully achieved inasmuch as subsequent oxidation steps will cause the thickness of the high voltage gate dielectric layer 210 to increase further. Following the removal of the high voltage dielectric layer 135 from the other areas of the semiconductor substrate 110, the semiconductor substrate 110 is conventionally cleaned and prepared for the next fabrication step.

Figure 3A:
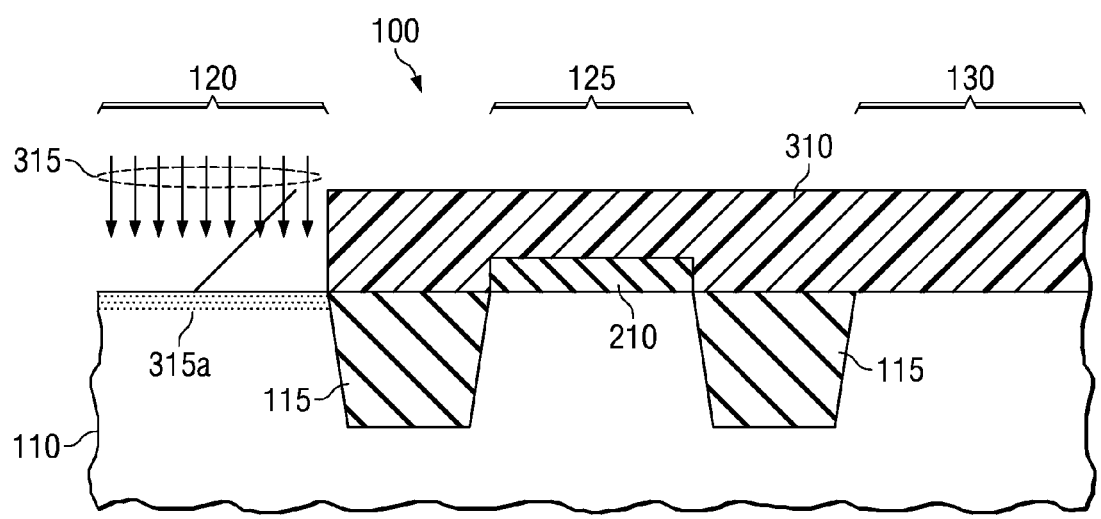
FIG. 3A illustrates a sectional view of the device illustrated in FIG. 2 during implantation of nitrogen into semiconductor substrate in the low voltage core region.

Referring now to FIG. 3A, there is illustrated a sectional view of the device 100 of FIG. 2 after a protective mask 310 has been conventionally deposited and patterned over the high voltage region 125 and the intermediate core region 130. As illustrated, the protective mask 310 protects the high voltage region 125 and the intermediate core region 130 while exposing the low voltage core region 120 to a low dose nitrogen implant 315, as designated by the arrows. The nitrogen ions are implanted into the semiconductor substrate 110 to form an implant region 315a in the low voltage core region 120 that has a concentration of nitrogen ranging from about 1E18 atoms/cm$^3$ to about 1E21 atoms/cm$^3$. The nitrogen implant 315 can be conducted in a conventional implant tool and at a number of energies that correspond to a number of beam currents, implant times, voltages and pressures, depending on how quick and deep it is intended for the implant to go. For example, in one embodiment, the implant may be conducted at energies ranging from about 1 keV to about 100 keV. In yet another embodiment, the implant can be conducted at energies ranging from about 5 keV to about 50 keV. More preferably, however, the implant is conducted at about 10 keV.

Like the voltage, the low dosage of the nitrogen implant 315 can also vary. In one embodiment, the dosage may range from about 1E13 ions/cm$^2$ to about 1E14 ions/cm$^2$. In another aspect, the dosage of the nitrogen may range from about 5E13 ions/cm$^2$ to about 5E14 ions/cm$^2$. In more specific embodiments, the dosage of the nitrogen may range from about 5E13 ions/cm$^2$ to about 1.5E14 ions/cm$^2$. The lower implant doses of nitrogen are advantageous in the present invention because the thicknesses of the low voltage core dielectric layer 325 and the intermediate core dielectric layer 330 are within about 0.1 nm to about 0.2 nm of each other. These lower doses of nitrogen have previously not been adequate because of the large thickness difference between the low voltage core dielectric layer and the I/O dielectric layer.

The present invention also provides other unexpected results. For instance, it has been found that varying the amount of nitrogen ion doping could precisely control the mean optical thickness of the low voltage core dielectric layer 325. For example, when no nitrogen implant was used on a wafer and was subjected to only a dual plasma nitridation process, the mean optical thickness was about 2.01 nm. However, at a nitrogen implant dosage of about 5E13 ions/cm$^2$, the mean optical thickness was about 1.97 nm. At a nitrogen implant dosage of about 1E14 ions/cm$^2$, the mean optical thickness was about 1.96 nm, and at a nitrogen implant dosage of about 1.5E14 ions/cm$^2$, the mean optical thickness was about 1.97 nm. Thus, it was found that dielectric layer thickness could be controlled to within less than about 0.1 nm.

Figure 3B:
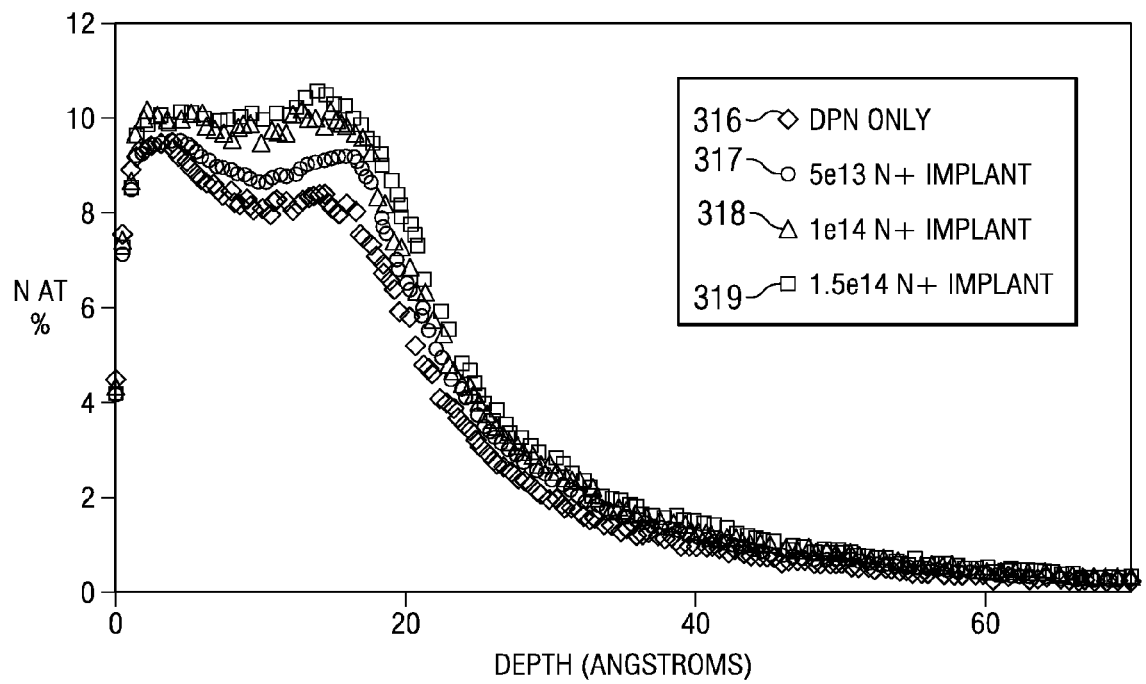
FIG. 3B illustrates a ToF SIMS graph of nitrogen profiles in samples having been implanted with differing concentrations of nitrogen.

FIG. 3B is a graph that illustrates further advantages provided by the present invention. By using the low dose nitrogen implant in conjunction with a secondary plasma nitridation process, it was also unexpectedly discovered that the atomic percent nitrogen concentration throughout the dielectric layer was much more uniform when compared to using just the secondary plasma nitridation process alone. The graphs in FIG. 3B depict four dielectric layer examples and effectively illustrate this premise.

The first, designated 316, is a graph of a dielectric layer that was formed using only a secondary plasma nitridation process, such as a dual plasma nitridation process. As seen from curve 316, the uniformity of the nitrogen concentration changed by as much as 2% across the thickness of the dielectric layer whose lower boundary extended to the silicon interface at about 1.8 to about 1.9 nm.

The second curve designated 317 was formed using a low dose nitrogen implant of about 5E13 ions/cm$^2$ prior to the use of the secondary plasma nitridation process. Again, as seen from curve 317, the uniformity of the nitrogen concentration changed by as much as 1.5% across the thickness of the dielectric layer whose lower boundary extended to the silicon interface at about 1.8 to about 1.9 nm.

In yet another example, the third curve designated 318 was formed using a low dose nitrogen implant of about 1E14 ions/cm$^2$ prior to the use of the secondary plasma nitridation process. As seen from curve 345, the uniformity of the nitrogen concentration significantly improved in that curve 318 flattened out considerably wherein the nitrogen concentration changed only by less than about 0.5% across the thickness of the dielectric layer whose lower boundary extended to the silicon interface at about 1.8 to about 1.9 nm.

The fourth curve designated 319 was formed using a low dose nitrogen implant of about 1.5E14 ions/cm$^2$ prior to the use of the secondary plasma nitridation process. As seen from curve 319, the uniformity of the nitrogen significantly improved in that the curve considerably flattened out wherein the nitrogen concentration changed only by less than about 0.5% across the thickness of the dielectric layer whose lower boundary extended to the silicon interface at about 1.8 to about 1.9 nm.

The uniformity of the nitrogen concentration across the thickness of the dielectric layer is beneficial because the more uniform the nitrogen concentration is, the more reliable and higher quality the dielectric layer is. This uniformity, which is reflected in the flatness of the curves shown in FIG. 3B shows a marked improvement, depending on the dosage of nitrogen used in the implant. It is theorized that the low dose nitrogen implant provides nitrogen to the dielectric layer during its formation in addition to the nitrogen that is being provided by the plasma nitridation process, as discussed above.

Figure 3C:
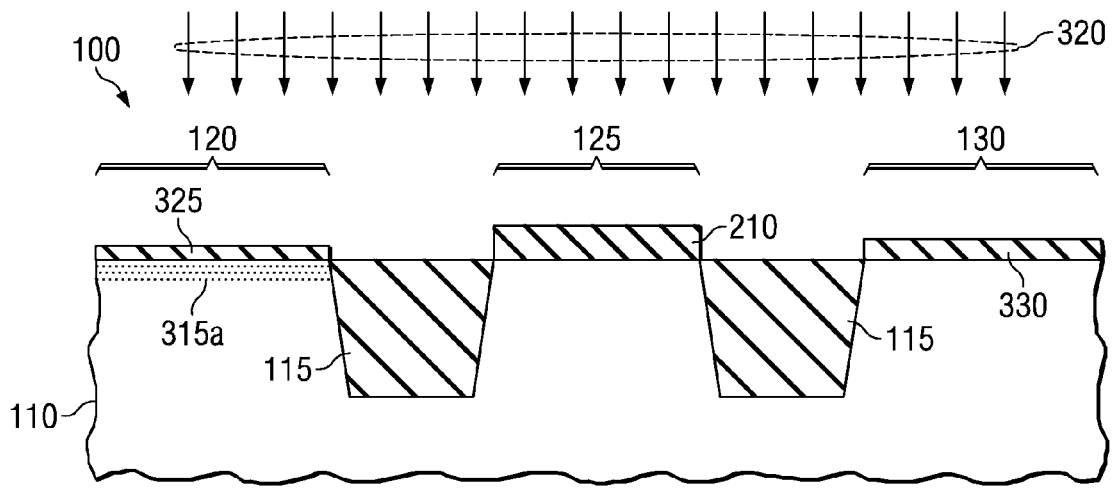
FIG. 3C illustrates a sectional view of the device of FIG. 3A during the formation of the low voltage core gate dielectric layer and the intermediate core gate dielectric layer during a plasma nitridation process.

Turning now to FIG. 3C with continued reference to FIG. 3A, in this particular illustration, the mask 310 has been removed, and the semiconductor substrate 110 has been cleaned. Following the cleaning step, the device 100 is subjected to an oxidation process conducted in the presence of a nitridation process 320, designated by the arrows to form a low voltage core dielectric layer 325 over the low voltage core region 120 and form an intermediate dielectric layer 330 over the intermediate region 130. The oxidation process may be conventionally conducted. For example, the flow rate of the oxygen may be at a temperature ranging from about 900° C. to about 1100° C., while the nitridation process may be a conventional plasma nitridation process conducted within the exemplary following parameters. The power may range from about 500 watts to a 1000 Watts, with a preferred wattage being about 760 Watts. The nitrogen flow rate may range from about 100 sccm to about 1000 sccm, with a preferred flow rate being about 500 sccm. The plasma may be conducted and at a pressure that may range from about 1 mT to about 50 mT, with 10 mT being an advantageous pressure and for a period of time ranging from about 1 second to about 1 minute with 15 seconds being an advantageous period of time.

Due to the presence of the nitrogen implant 315*a*, the slightly thicker intermediate dielectric layer 330 can be grown within to about 0.1 nm to about 0.2 nm of the target thickness of the low voltage core dielectric layer 325, which may range from about 0.7 nm to about 2 nm. Moreover, this can be accomplished without the need of additional masking and cleaning steps as required by prior art processes, and the lower dose of nitrogen does not significantly damage the substrate surface as with the prior art processes.

Figure 4:
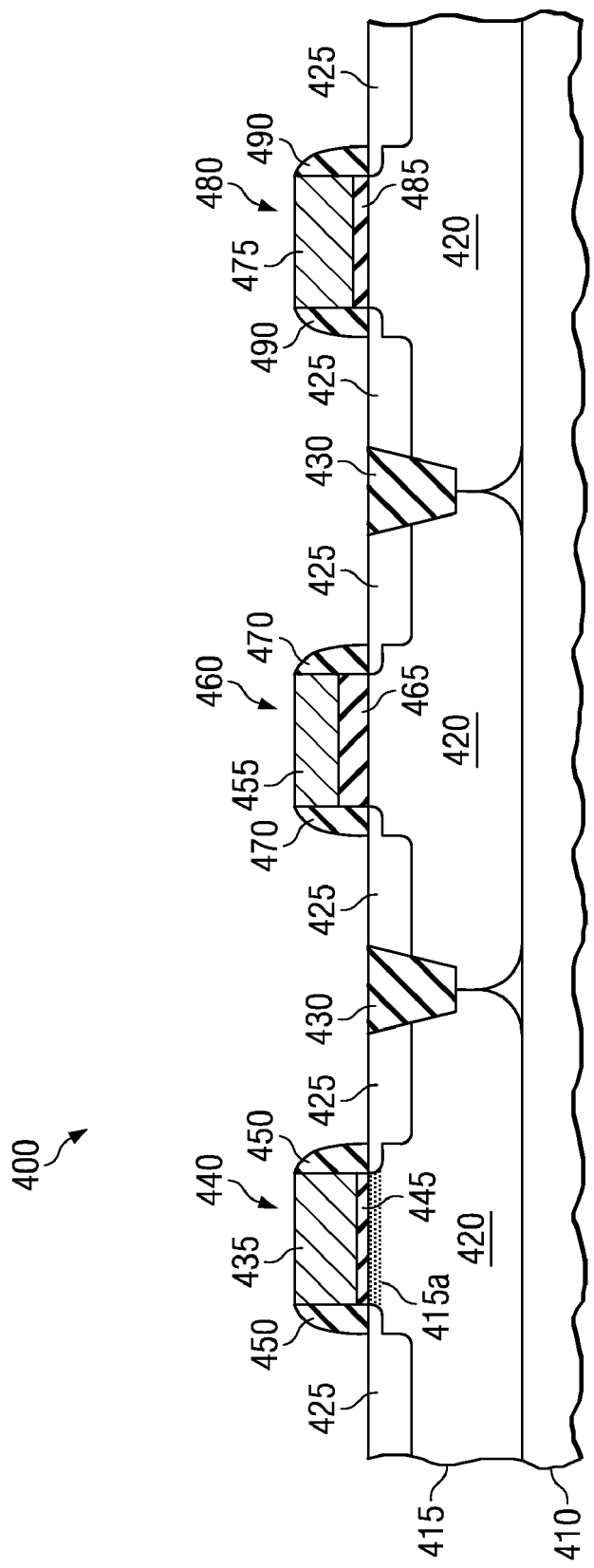
FIG. 4 illustrates a sectional view of the device shown in FIG. 3C after the formation of tri-gate structures.

Turning now to FIG. 4, there is illustrated a sectional view of the device 100 shown in FIG. 3C after the formation of tri-transistor gates, which may be formed using conventional materials and processes to achieve the tri-gate devices. In the illustrated embodiment, the tri-gate device 400 includes a semiconductor substrate 410 over which is formed a tub or well layer 415. Wells 420 and source/drain regions 425 and the nitride region 415*a* are formed within the layer 415. The wells 420 are electrically isolated by conventionally formed isolation structures 430 and are doped according to specifications. A low voltage core gate 435 is formed over a low voltage core region 440 and is isolated from the well 420 using a low voltage core gate dielectric layer 445 that may be formed as discussed above. The low voltage core gate 435 also includes spacers 450. Shown adjacent the low voltage core gate 435 for clarity, is a high voltage gate 455 formed over a high voltage region 460. The high voltage gate 455 is isolated from the well 420 using a high voltage gate dielectric layer 465 formed in accordance with the present invention. The high voltage gate 455 also includes spacers 470.

The tri-gate device 400 also uniquely includes an intermediate core gate 475 that is formed over an intermediate core region 480 and is isolated from the well 420 using an intermediate core gate dielectric layer 485 that may be formed as discussed above. The intermediate core gate 475 also includes spacers 490. Also, the tri-gate device 400 may also include metal silicide contact regions on the source/drain regions 425, which are not shown. This tri-gate device 400 can easily be incorporated into an integrated circuit, as shown in FIG. 5.

Figure 5:
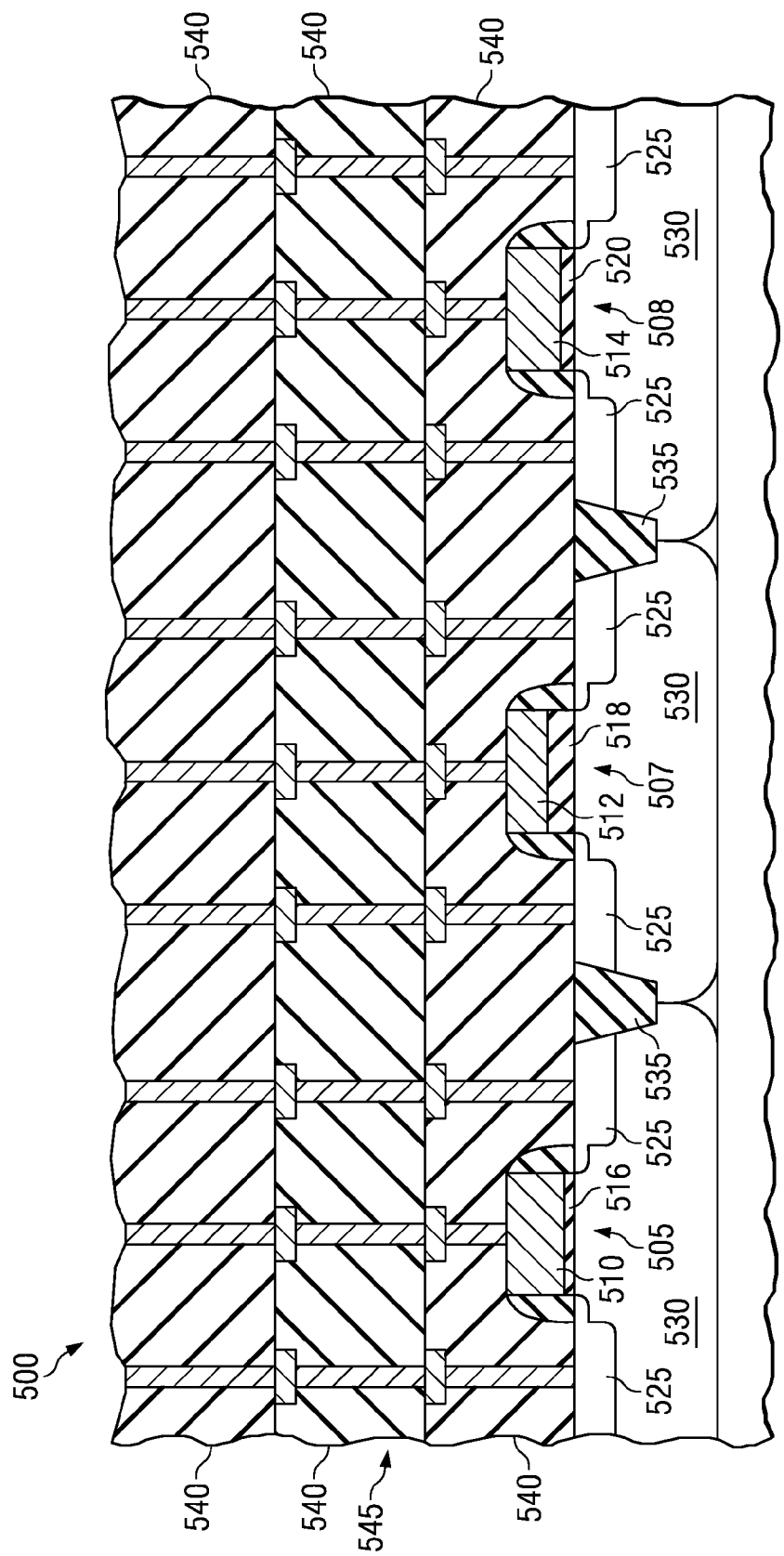
FIG. 5 illustrates a partial view of a tri-gate integrated circuit device that can be fabricated in accordance with the principles of the present invention.

FIG. 5 represents a partial view of a tri-gate integrated circuit device 500 that can be fabricated in accordance with the principles of the present invention. The integrated circuit 500 includes low voltage core transistors 505, high voltage transistors 507, and intermediate core transistors 508 that each respectively includes a low voltage core gate 510, a high voltage gate 512, and an intermediate core gate 514. The gates 510, 512 and 514 are doped to operate at their respective designed parameters. The low voltage core gate 510 is electrically isolated by a nitridated, low voltage core gate dielectric 516, the high voltage gate 512 is electrically isolated by the high voltage gate dielectric 518, and the intermediate core gate 514 is electrically isolated by intermediate gate dielectric 520, all of which are fabricated in accordance with the principles of the present invention, as described above.

The transistors 510, 512, and 514 also each include source/drains 525 formed in wells 530, which can be doped as desired. Conventional isolation structures 535, as described above, separate and electrically isolate the transistors 510, 512, and 514 from each other. Interlevel dielectric layers 540 are located over the transistors 510, 512, and 514 and interconnects 545 are formed therein to interconnect the various transistors 510, 512, and 514 to form an operative integrated circuit. Given the teachings of present application, one who is skilled in the art would know how to form the operative integrated circuit as shown in FIG. 5.

Although the present invention has been described in detail, those skilled in the art should understand that they can make various changes, substitutions and alterations herein without departing from the spirit and scope of the invention in its broadest form.

What is claimed is:

1. A method for fabricating a tri-gate semiconductor device, comprising:
   forming a high voltage gate dielectric layer over a semiconductor substrate of said tri-gate semiconductor device;
   implanting a low dose of nitrogen into said semiconductor substrate in a low voltage core region; and
   forming a low voltage core gate dielectric layer over said low voltage core region, including forming an intermediate core gate dielectric layer over an intermediate core region;
   wherein said forming said low voltage core gate dielectric layer and said intermediate core gate dielectric layer is conducted in the presence of an environment containing nitrogen.

2. The method as recited in claim 1 wherein said low dose ranges from about 1E13 ions/cm$^2$ to about 1E14 ions/cm$^2$.

3. The method as recited in claim 2 wherein said low dose ranges from about 5E13 ions/cm$^2$ to about 5E14 ions/cm$^2$.

4. The method as recited in claim 1 wherein a thickness of said intermediate core dielectric layer is within about 0.1 nm to about 0.2 nm of a thickness of said low voltage core gate dielectric layer.

5. The method as recited in claim 4 wherein a thickness of said low voltage core gate dielectric layer ranges from about 0.7 nm to about 2 nm and said high voltage gate dielectric layer ranges from about 2.5 nm to about 8 nm.

6. The method as recited in claim 1 wherein said implanting includes implanting said nitrogen at an implant energy ranging from about 1 keV to about 100 keV.

7. The method as recited in claim 1 further including forming a first gate over said high voltage gate dielectric layer, forming a second gate over said low voltage core gate dielectric layer and forming a third gate over said intermediate core dielectric layer.

8. The method as recited in claim 7 wherein forming said second gate includes forming said second gate such that a concentration of nitrogen within said second gate is substantially uniform throughout said second gate.

9. A method for manufacturing a tri-gate integrated circuit, comprising:
   forming high voltage gate dielectric layers over a semiconductor substrate;
   implanting a low dose of nitrogen into said semiconductor substrate in low voltage core regions; and
   forming core gate dielectric layers over said low voltage core regions, including forming intermediate core gate dielectric layers over intermediate core regions;
   forming first transistor gates over said high voltage gate dielectric layers, second transistor gates over said low voltage core gate dielectric layers and third transistor gates over said intermediate core dielectric layers;
   forming source/drain regions associated with each of said first, second and third transistor gates; and
   forming interconnects extending through dielectric layers located over first, second and third transistor gates to interconnect said first, second and third transistor gates to form an operative tri-gate integrated circuit.

10. The method as recited in claim 1 wherein said low dose ranges from about 5E13 ions/cm$^2$ about 5E14 ions/cm$^2$.

11. The method as recited in claim 9 wherein a thickness of said intermediate core dielectric layers are within about 0.1 nm to about 0.2 nm of a thickness of said core gate dielectric layers.

12. The method as recited in claim 11 wherein a thickness of said low voltage core gate dielectric layers range from about 0.7 nm to about 2 nm and said high voltage gate dielectric layer ranges from about 2.5 nm to about 8 nm.

13. The method as recited in claim 9 wherein forming said low voltage core gate dielectric layer and said intermediate core dielectric layers is conducted in the presence of a plasma environment containing nitrogen.

14. The method as recited in claim 9 wherein said implanting includes implanting said nitrogen at an implant energy ranging from about 1 keV to about 100 keV.

15. The method as recited in claim 9 wherein forming said second gates includes forming said second gates such that a concentration of nitrogen within each of said second gates is substantially uniform throughout said second gates.

16. The method as recited in claim 15 wherein an atomic percentage of said nitrogen varies by about 1 percent throughout each of said second gates.

* * * * *